(12) United States Patent
Ramm et al.

(10) Patent No.: US 10,711,341 B2
(45) Date of Patent: Jul. 14, 2020

(54) SYNTHESIS OF METAL OXIDES BY REACTIVE CATHODIC ARC EVAPORATION

(75) Inventors: Jürgen Ramm, Maienfeld (CH); Beno Widrig, Bad Ragaz (CH)

(73) Assignee: OERLIKON SURFACE SOLUTIONS AG, PFÄFFIKON, Pfäffikon SZ (CH)

(*) Notice: Subject to any disclaimer, the term of this patent is extended or adjusted under 35 U.S.C. 154(b) by 387 days.

(21) Appl. No.: 13/579,956

(22) PCT Filed: Feb. 10, 2011

(86) PCT No.: PCT/EP2011/000383
§ 371 (c)(1),
(2), (4) Date: Oct. 23, 2012

(87) PCT Pub. No.: WO2011/103955
PCT Pub. Date: Sep. 1, 2011

(65) Prior Publication Data
US 2013/0048490 A1   Feb. 28, 2013

Related U.S. Application Data

(60) Provisional application No. 61/328,238, filed on Apr. 27, 2010.

(30) Foreign Application Priority Data

Feb. 28, 2010   (EP) .................................. 10002039

(51) Int. Cl.
C23C 14/00 (2006.01)
C23C 14/08 (2006.01)
C23C 14/32 (2006.01)

(52) U.S. Cl.
CPC ........ C23C 14/325 (2013.01); C23C 14/0021 (2013.01); C23C 14/08 (2013.01); C23C 14/081 (2013.01); C23C 14/083 (2013.01)

(58) Field of Classification Search
CPC ..... C23C 14/325; C23C 14/081; C23C 14/08; C23C 14/0021; C23C 14/02
See application file for complete search history.

(56) References Cited

U.S. PATENT DOCUMENTS

2008/0090099 A1* 4/2008 Ramm et al. ................. 428/699
2009/0191417 A1   7/2009 Ramm

OTHER PUBLICATIONS

International Search Report for PCT/EP2011/000383 dated Apr. 15, 2011.

(Continued)

*Primary Examiner* — Michael A Band
(74) *Attorney, Agent, or Firm* — Pearne & Gordon LLP

(57) ABSTRACT

In these investigations, an attempt has been made to correlate the deposition parameters of the reactive cathodic arc evaporation with processes at the surface of the composite Al—Cr targets and the nucleation and phase formation of the synthesized Al—Cr—O layers. The oxygen partial pressure and the pulsed operation of the arc current influence the formation of intermetallic phases and solid solutions at the target surface. The nucleation of the ternary oxides at the substrate site appears to be, to some extent, controllable by the intermetallics or solid solutions formed at the target surface. A specific nucleation process at substrate site can therefore be induced by the free choice of target composition in combination with the partial pressure of the oxygen reactive gas. It also allows the control over the oxide island growth at the target surface which occurs occasionally at higher oxygen partial pressure. This hypothesis is supported by the X-ray diffraction analysis of the layers as well as of the target surface.

6 Claims, 6 Drawing Sheets

(56) References Cited

OTHER PUBLICATIONS

Figure 1:
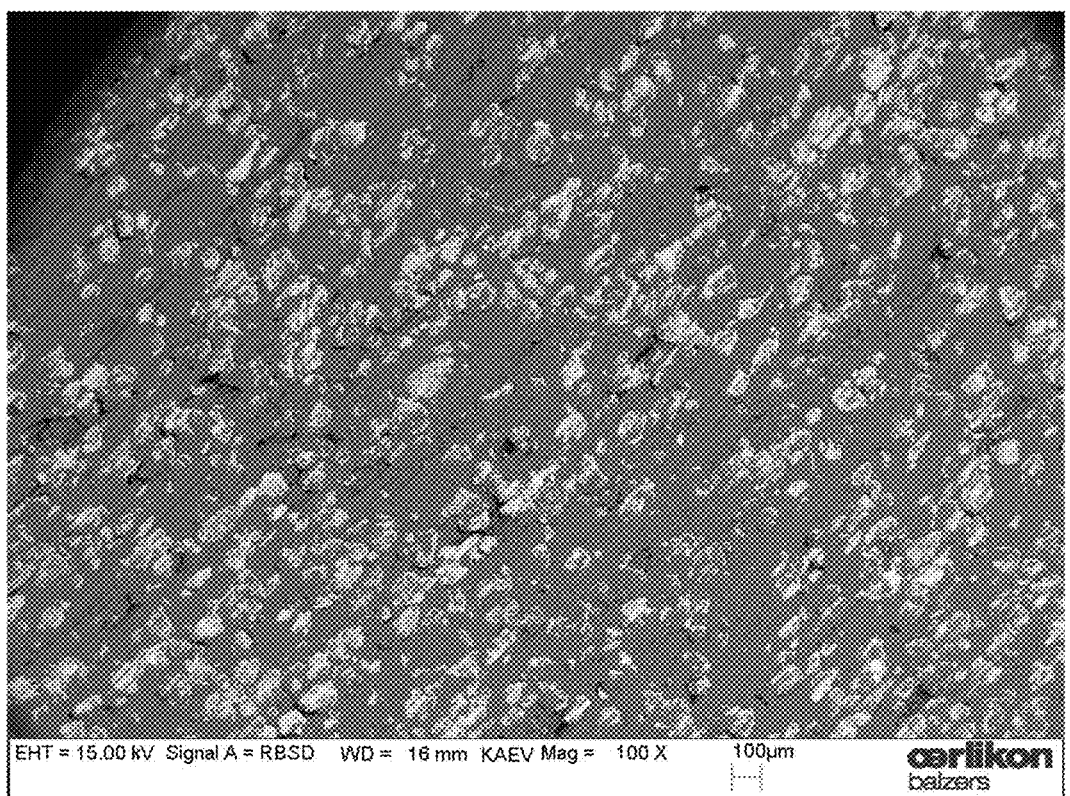

Levchuk, et al., "Al—Cr—O Thin Films as an Efficient Hydrogen Barrier", Surface and Coatings Technology, Elsevier, Amstgerdam, NL, vol. 202, No. 20, Jul. 20, 2008, pp. 5043-5047.
Ramm, et al., "Pulse Enhanced Electron Emission (P3e(TM)) Arc Evaporation and the Synthesis of Wear Resistant Al—Cr—O Coatings in Corundum Structure", Surface and Coatings Technology, Elsevier, Amsterdam, NL, vol. 202, No. 4-7, Nov. 13, 2007, pp. 876-883.
Written Opinion for PCT/EP2011/000383 dated Apr. 15, 2011.

\* cited by examiner

SYNTHESIS OF METAL OXIDES BY REACTIVE CATHODIC ARC EVAPORATION

There have been efforts for many years to establish cathodic arc evaporation for oxide deposition. Issues associated with process stability and droplet formation prevented the utilization of this technology on a large scale in production and initiated the development of the filtered arc technology which produces oxides for optical and other dedicated applications [1]. Although cathodic arc technology is well understood and the dominant technology in the PVD tool coating business for conductive layer materials, the deposition of oxides utilizing this technology for wear resistant coatings has only recently been enabled by the development of a dedicated production technology (P3e™) [2]. The robustness of this technology is based on its inherent broad process window which permits the arc operation in pure reactive gas, a variation in process pressure over several decades, the freedom in the selection of reactive gases and target materials, and the easiness of adjusting deposition rates. The direct exposure of the substrates to the targets results in the well known high deposition rates of the conventional arc evaporation. All these aspects make this technology unique amongst PVD technologies.

Oxides synthesized by reactive cathodic arc evaporation have been already investigated for die casting applications [3], show potential for thermal barrier coatings [4] and as hydrogen diffusion barrier [5]. Among them, ternary oxides are of distinctive interest for wear protective coatings [6]. Their synthesis is based on the utilization of composite targets. The targets are produced from elemental powders which are densified at high pressure and temperature or produced by similar methods. These methods of production allow a nearly free choice of composition of the target constituents. In our investigations, an attempt has been made to correlate the surface of powder metallurgical composite Al—Cr targets with the nucleation and phase formation of Al—Cr—O layers at the substrate surface. In P3e™ technology the substrates are directly exposed to the target surface. This ensures a high efficiency of the evaporation process. It has, however, the disadvantage that droplets are incorporated in the growing layer as it is also known from nitride deposition with direct substrate exposure. It was suspected that understanding of the processes at the target surface may help to find approaches to reduce the droplet generation and to control the occasionally occurring oxide island growth at the target surface.

The experiments were performed in an INNOVA batch-type production system of OC Oerlikon Balzers AG which is used to coat cutting tools with wear resistant layers. In addition to the deposition of conventional coatings of nitrides and carbo-nitrides, the system allows the synthesis of oxides in stable processes (P3e™). The operation of the targets during oxide deposition usually proceeds in a pure oxygen atmosphere. For these experiments, the oxygen flow was controlled by a flow controller. The arc sources were operated with DC as well as with pulsed arc current. For the pulsed operation the pulse parameters (pulse width 0.5 ms, pulse height 420 A, frequency 666 Hz) were chosen so that the time average of the pulsed arc current was 200 A and equal to DC operation. The substrates were mounted at substrate holders with two-fold rotation and with direct line-of-sight to the arc source and target surface. In each process new targets were utilized to exclude the influence of target surface cleaning. Powder metallurgical produced Al—Cr targets with a composition of 70 at % Al and 30 at % Cr were utilized for the experiments. The substrates, pieces of (100) silicon wafers and polished cemented carbide inserts, were wet-chemically cleaned before deposition. After evacuation of the process chamber below $10^{-5}$ mbar, standard heating and etching steps were performed to ensure a good layer adhesion to the substrate. For the deposition of the samples in the experiments, only one arc source was utilized and the samples were positioned at the height of the source. For all depositions, a substrate temperature of 550° C. and a substrate bias of −60 V were selected. The symmetric bipolar bias voltage had a frequency of 25 kHz with a negative pulse length of 36 μs and 4 μs positive pulse length. The deposition parameters are summarized in Table 1. As the depositions were performed in pure oxygen reactive gas the total pressure given in Table 1 represents the oxygen partial pressure. Differing deposition parameters of additional experiments are mentioned in their respective description. A more detailed description of the deposition process and the P3e™ approach is given elsewhere [2].

The analysis of the target surfaces was performed in a LEO 1530 scanning electron microscope (SEM). Elastically back-scattered electrons were utilized to enhance the material contrast and to visualize the existence of materials with different atomic number before and after arc operation. The thicknesses of the deposited layers were obtained from fracture cross-sections (X-SEM) of the coated cemented carbide inserts.

To investigate the crystal structure, X-ray diffraction was performed at the target surface and on the coated silicon samples. The measurements were performed on a PANalytical X'Pert MRD PRO instrument using Cu Kα-radiation in the ω/2θ mode for all target samples and in the grazing incident mode (2θ scan, ω=1°) for all layer samples. The grazing incident technique is applied in order to get more information from the coated layer. The ICDD-data base [7] was used to identify the crystallographic phases being present at the target surface and in the coatings. The grain sizes were estimated using the Scherrer Formula [8].

The layer composition was analyzed by Rutherford Backscattering Spectrometry (RBS) [9]. The measurements were performed using a 2 MeV, $^4$He beam and a silicon surface barrier detector under 165°. The collected data were evaluated using the RUMP program [10].

Figure 2:
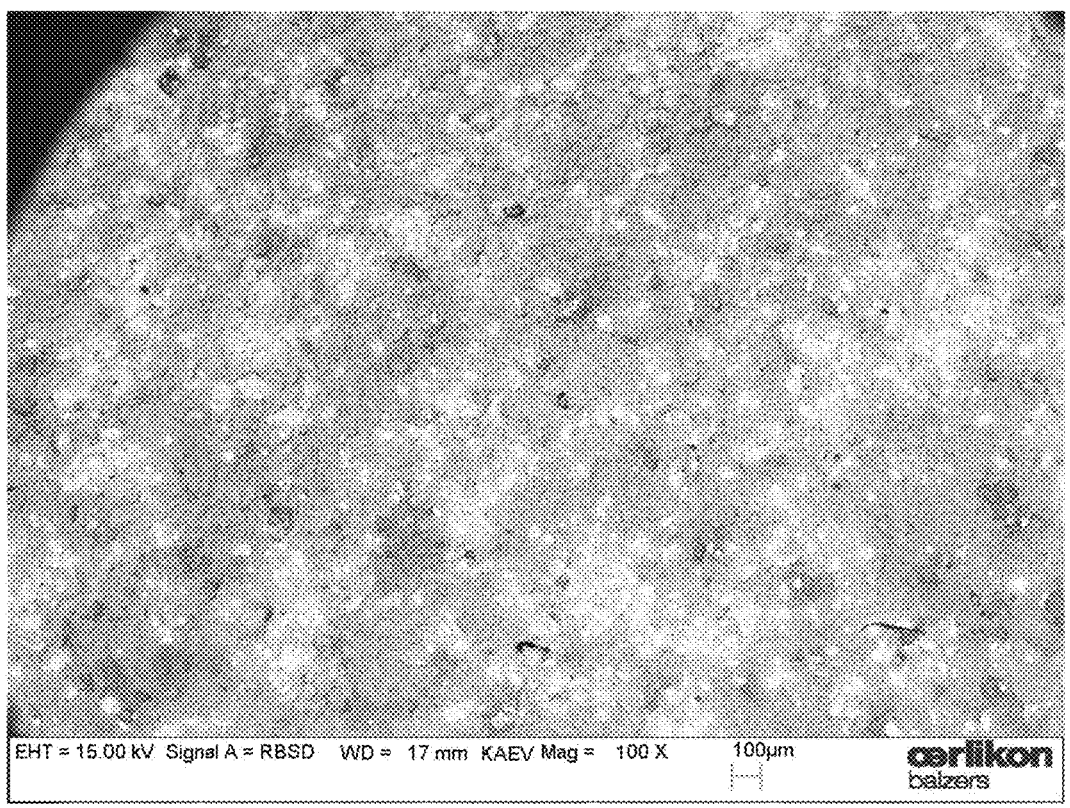
Figure 3:
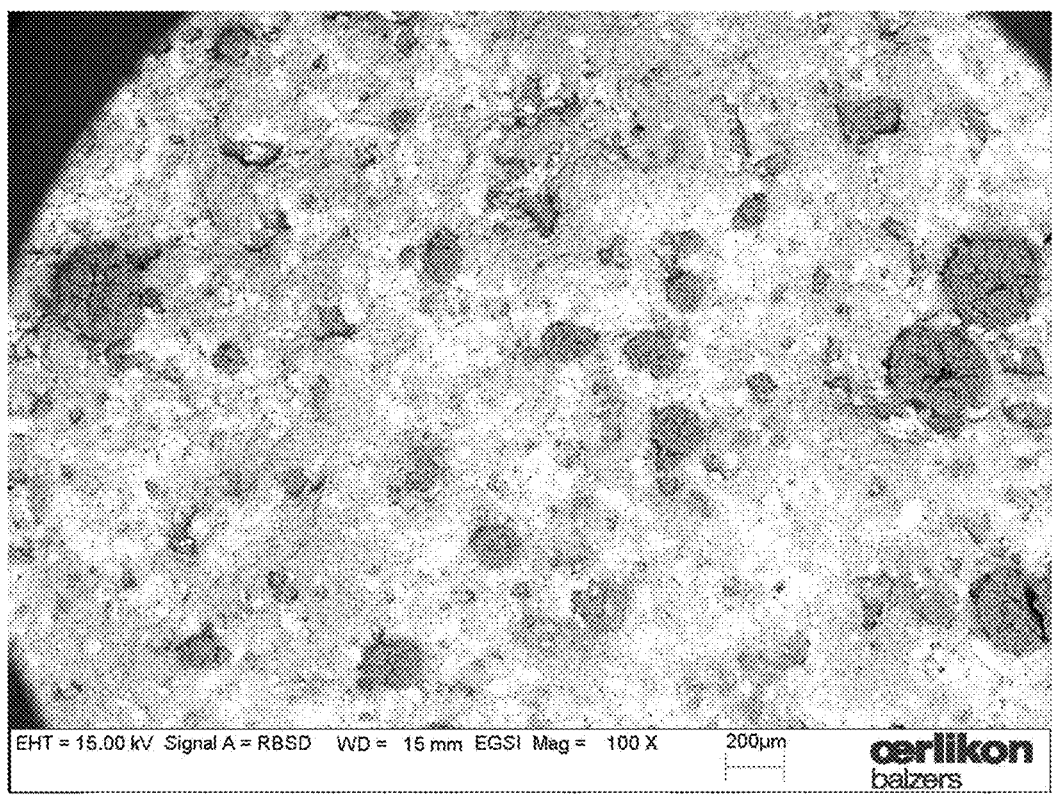

The exposure of composite target surfaces to oxygen reactive gas during cathodic arc operation is rather new and we therefore want to illustrate the issue in more detail. FIG. 1 shows the target surface of an unused Al—Cr target with the nominal composition of 70 at % Al and 30 at % Cr visualized by elastically back-scattered electrons in the SEM. The dark regions at the target surface stem from elemental aluminium, the light regions with the higher intensity from chromium. In FIG. 2, a target surface is shown which was obtained after a deposition process. In this specific process two Al—Cr targets with the same composition were utilized and operated at 200 A DC with an oxygen flow of 300 sccm for a time of 75 min. A distinctive modification of the target surface is visible. The contrast between the elemental Al and Cr regions from FIG. 1 changed to regions with less contrast. An additional aspect is illustrated in FIG. 3. In this experiment, again two targets were operated at 200 A for 75 min, but with the much higher oxygen flow of 1000 sccm. Comparing with the unused target surface, the contrast is changed and regions of different intensities are visible. In addition, three-dimensional island growth differing in size can be recognized at the target surface. The EDX analysis of the islands suggested aluminum oxide and the hardness suggested that this is mainly α-$Al_2O_3$.

Figure 4:
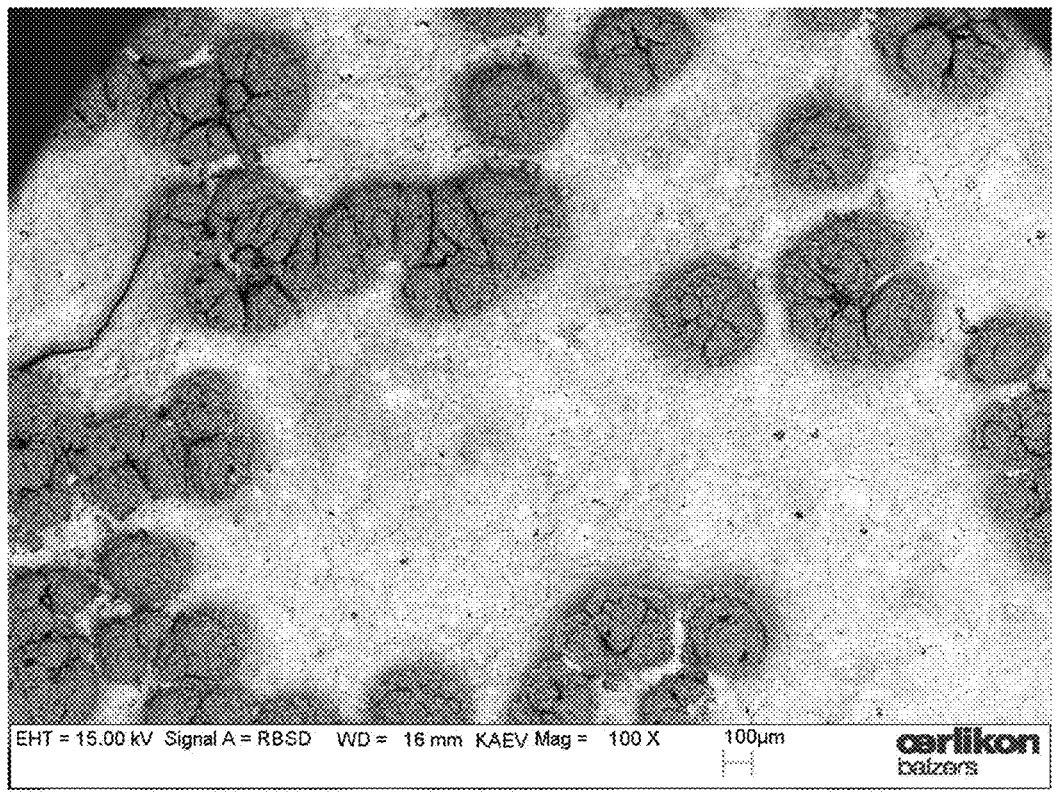
Figure 5:
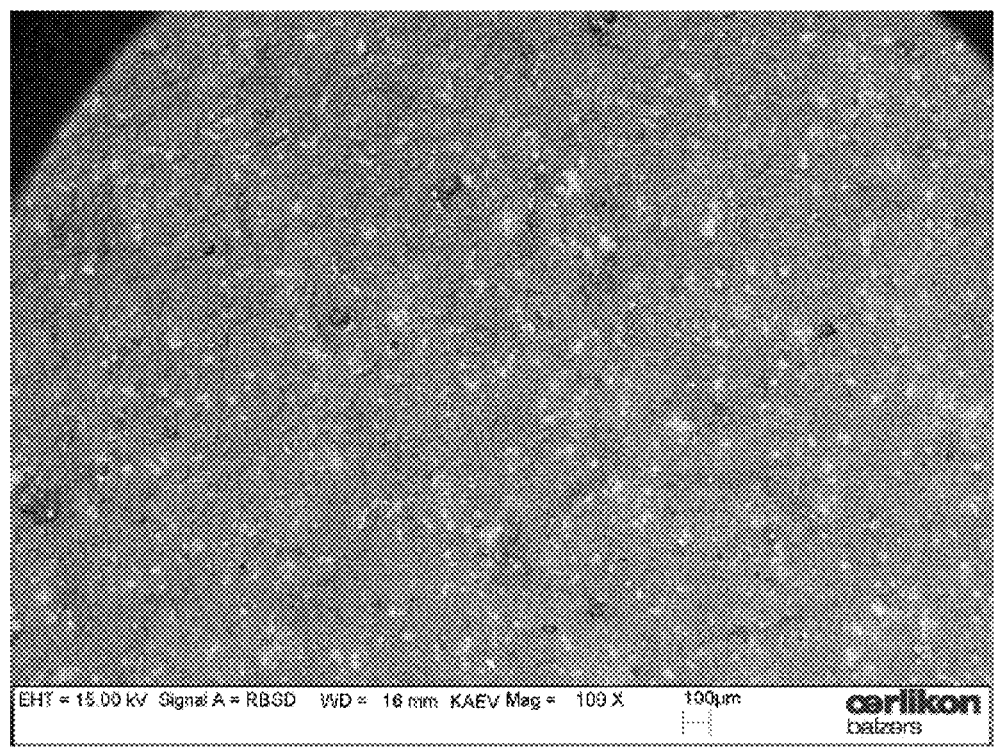

The number and size of these islands are growing with time and require a cleaning of the target after the deposition process. This island growth could not be observed at the surface of elemental targets, neither for low melting point material (e.g. aluminium) nor for refractory materials (e.g. tantalum). The island growth appeared only for very high oxygen flows and, surprisingly, not for all material compositions and especially also not for all composite targets which contain aluminium as the one constituent with low melting point. FIG. 4 displays the target surface of an Al—V target with a nominal composition of 65 at % Al and 35 at % V, which was operated at 200 A for one hour with an oxygen flow of 1000 sccm. The growth of islands is striking. In FIG. 5, the surface of an Al—V target with a nominal composition of 85 at % Al and 15 at % V is shown which was operated under the same conditions with respect to operation time, arc current and oxygen flow. No island growth can be detected at the target surface. These observations induced the following investigations about the processes at the target surface during reactive arc evaporation and their influence on the nucleation of the layers.

Figure 6:
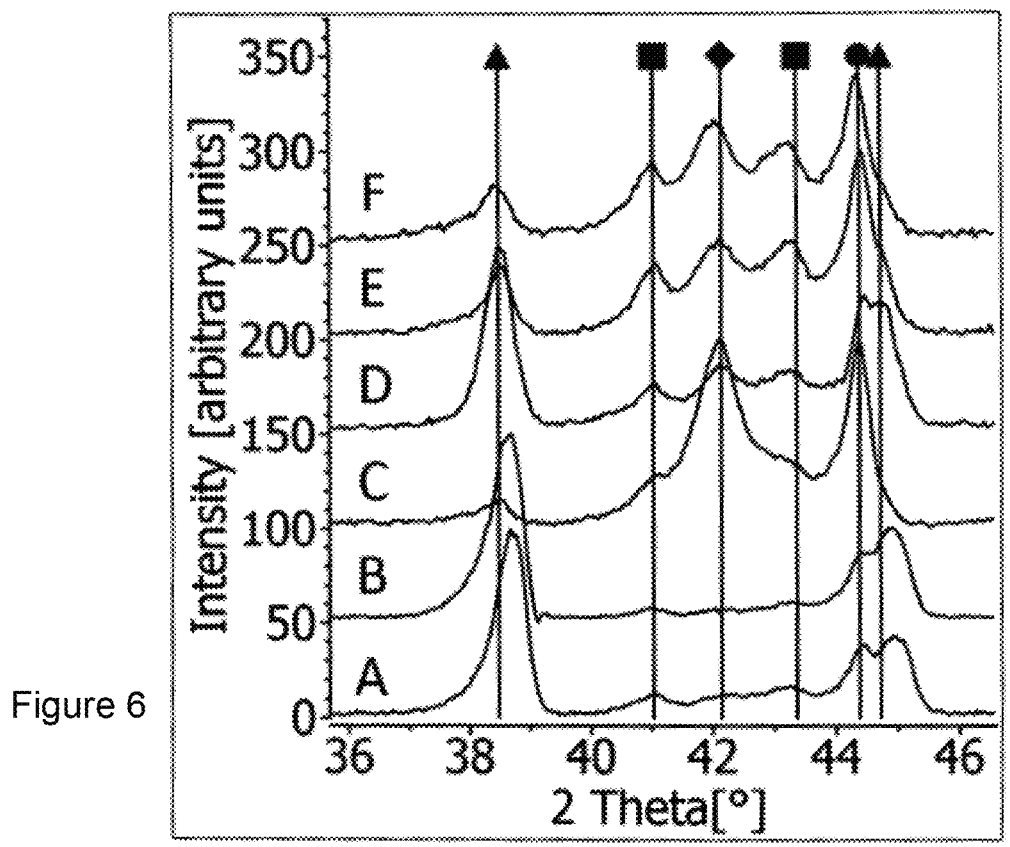

The experiments were conducted under 6 different process conditions A to F according to the parameters given in Table 1. First the surface of a new target was inspected by XRD. In this diffraction pattern (not shown here) only the Al and Cr peaks are visible in accordance with the SEM picture. The XRD pattern of the ω/2θ scans of all target surfaces operated under the conditions listed in Table 1 are compared in FIGS. 6 and 7. The whole diffraction pattern was divided into two regions to give more detailed information. In a first experiment the targets were operated for 3 min only. In FIG. 6, the XRD pattern of the target surface operated in process A shows a shift of the Al peak (triangle) to larger 2Theta values (38.7°, 45.0°). This shift indicates the formation of an AlCr solid solution ($AlCr_{ss}$) with a fraction of about 2.6 at % Cr [38.7° corresponds to the $AlCr_{ss}$ (111) reflection and 45.0° to the $AlCr_{ss}$ (200) reflection]. Besides the Cr peak (circle), additional peaks at 41.0°, 42.2° and 43.2° are visible which can be attributed to the intermetallic compounds of $Al_4Cr$ (square) and $Al_8Cr_5$ (diamond) [reflections at 41.0° and 43.2° correspond to the $Al_4Cr$ phase and 42.2° to the $Al_8Cr_5$ (411) reflection]. Very similar results are obtained for the XRD scan of the target surface from process B. Also here, a formation of the $AlCr_{ss}$ is clearly seen. The increased operation time results in a remarkable change of the XRD pattern. The target surface of process C shows only little Al, but intense peaks of Cr and for the intermetallic compound $Al_8Cr_5$ indicating relatively high concentrations of the latter two phases. One can also recognize additional but weaker peaks of $Al_4Cr$. The higher oxygen flow of 800 sccm changes the phase formation at the target surface completely (process D). The Al intensities dominate the diffraction pattern with a slight shift indicating the formation of $AlCr_{ss}$. The intensities of the intermetallics of $Al_4Cr$ and $Al_8Cr_5$ are weaker with similar intensities to each other. Consequently, the Al phase has the highest concentration with respect to the others. The pulsed operation of the targets in oxygen (process E and F) results in similar phase formations at the target surface being in principle independent from the oxygen flow. Cr shows the highest peak intensity, while Al and the intermetallics are similar in intensity. Consequently, the chromium phase shows the highest concentration with respect to the others.

Figure 7:
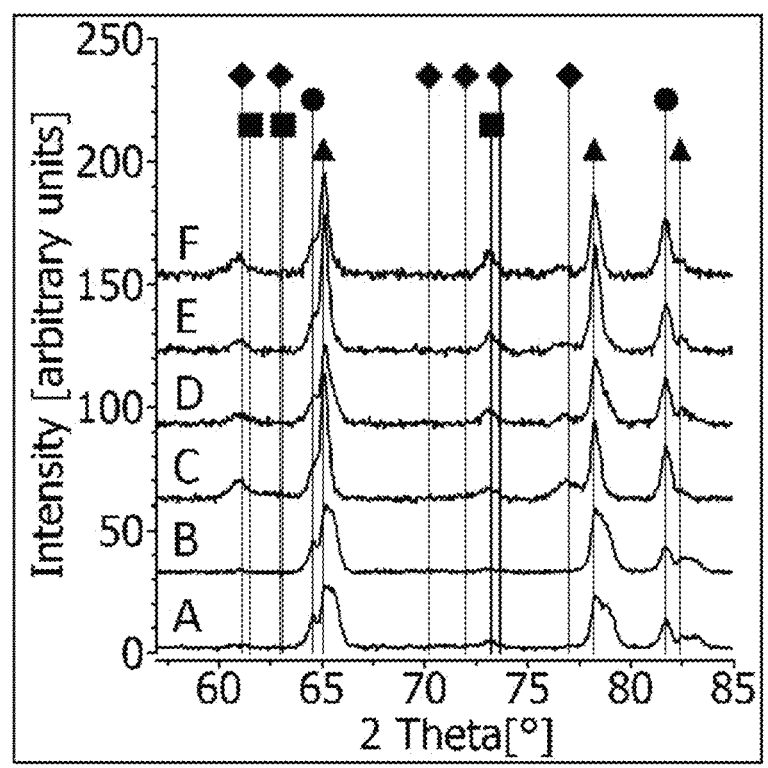

The XRD diffraction patterns of the target surfaces for the high angle range (2Theta range 55°-85°) shown in FIG. 7 confirm the findings from the lower 2Theta range. The shoulder of the Al peaks at 78.8° [$AlCr_{ss}$ (311) reflection] and 83.0° [$AlCr_{ss}$ (222) reflection] again show the formation of the $AlCr_{ss}$. The formation is especially pronounced at the target surfaces of A and B. Nevertheless, for the 2Theta position at 78.8°, it is also visible in all the other samples. The Cr content is lower in A and B, while the highest Al content is found for D. Again, the peaks of both $Al_4Cr$ (73.2°) and $Al_8Cr_5$ [61.1° for $Al_8Cr_5$ (600) reflection] show the formation of the intermetallic compounds.

Figure 8:
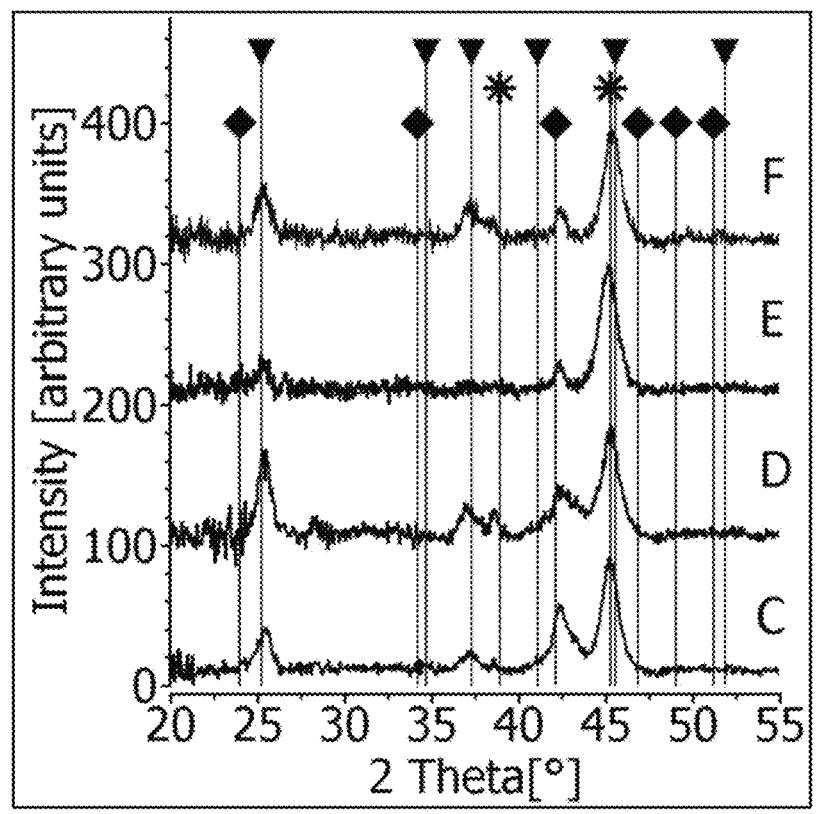

For all experiments mentioned above, oxide layers were synthesized simultaneously. The XRD analysis of these layers will be discussed now. Exceptions are the layers produced in process A and B resulting in layer thicknesses of only about 100 nm which were too thin for standard XRD investigations. FIG. 8 displays the comparison of the XRD patterns of the layers C, D, E and F in the 2Theta range between 20° and 55°. The deposition time for all of these samples was 30 min. The thickness of the synthesized layers is, however, different. Higher oxygen flow reduces the evaporation rate of the Al/Cr target by about 30% compared to the lower oxygen flow. It results in a layer thickness of 0.6 µm for 800 sccm compared to 0.9 µm for 300 sccm oxygen flow. The pulsed operation results in similar evaporation rates for the different flows. However, the distribution of the evaporated material is narrower compared to DC operation. Therefore, the substrates positioned at the height of the target show larger layer thickness [11]. The peaks of the synthesized oxides should be compared first. The corundum-type structure of $(Al,Cr)_2O_3$ (down triangle) is confirmed by the presence of reflections at 25.3° [$(Al,Cr)_2O_3$ (012) reflection], 37.2° [$(Al,Cr)_2O_3$ (110) reflection] and 45.3° [$(Al,Cr)_2O_3$ (202) reflection]. This is valid for all layer samples. However, all the layers show low crystallinity. For DC as well as for pulsed arc operation, the full width at half maximum (FWHM) of the peaks decreases for higher oxygen flows. The smallest FWHM is found for peaks of the corundum-type oxide of sample D, the layer with the lowest thickness, but produced with high oxygen flow. The crystallite size can be estimated with about 10 nm for samples C and E (both 300 sccm $O_2$ flow) and with 20 nm and 15 nm for samples D and F (both 800 sccm $O_2$ flow), respectively.

The additional phases in the synthesized layers based on FIG. 8 are discussed here. In the diffraction patterns of the layer samples C, D, E and F, the $AlCr_{ss}$ phase (star) is clearly visible with peaks at 38.9° [$AlCr_{ss}$ (111) reflection], 45.3° [$AlCr_{ss}$ (200) reflection] and 65.9° [$AlCr_{ss}$ (220) reflection, not shown here] and with an estimated Cr content of 6 at %. For the (200) and (220) reflections, a peak broadening is visible. The $(Al,Cr)_2O_3$ phase appears here as shoulder which is best seen for the $(Al,Cr)_2O_3$ shoulder at 65.3° (not shown here). The $AlCr_{ss}$ phase is dominating the diffraction pattern indicating its high concentration in the layer. A minor phase of $Al_8Cr_5$ can also be indexed in all layer samples shown in FIG. 8. Additional peaks at 24.0° [$Al_8Cr_5$ (211) reflection] and 42.2° [$Al_8Cr_5$ (411) reflection] are found.

Figure 9A:
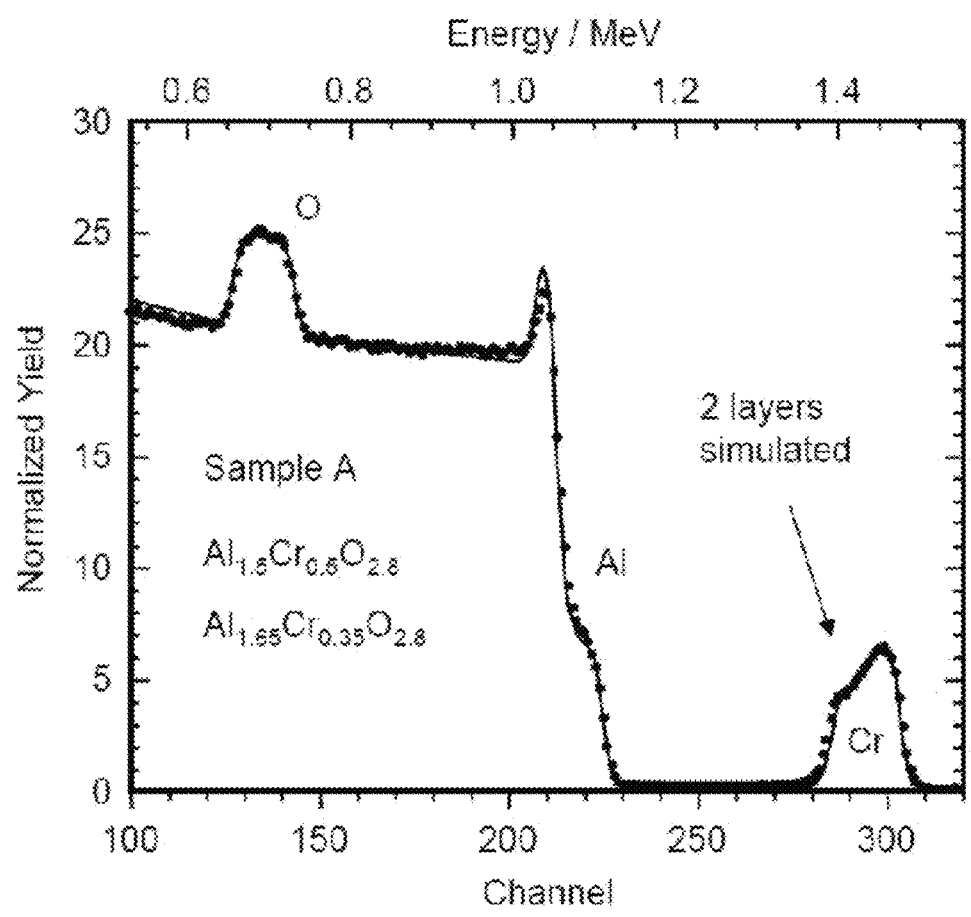

As already mentioned, the layers of samples A and B were too thin for XRD analysis. RBS analysis was performed for these samples to gain more information about the composition and composition gradients. FIG. 9a shows the RBS spectrum of sample A which was synthesized with 300 sccm oxygen flow. The separation of the Cr signal in the spectrum shows a gradient in the composition. The layer had to be simulated as double layer assuming a composition of $Al_{1.5}Cr_{0.5}O_{2.8}$ and $Al_{1.65}Cr_{0.35}O_{2.8}$ in order to obtain a reasonable fit. The signal of sample B produced with 800 sccm oxygen flow could be fitted by a single layer with the composition of $Al_{1.45}Cr_{0.55}O_{3.0}$.

Comparing FIGS. 1 and 2, it can be seen that the target surface of the Al—Cr composite target undergoes transformations during the operation in an arc discharge. The reduced material contrast at the target surface in FIG. 2 obtained by elastically back-scattered electrons suggests "mixing" of the target constituents. It is a significant modification of the elemental distribution of the unused target visible. However, there are still regions with different brightness indicating different material composition or phases. An increase of the oxygen flow (FIG. 3) induces island growth of aluminium oxide at the Al—Cr composite target. It is necessary to mention that this island growth did not occur for the processes according to Table 1, because the operation time was too short and the XRD analysis does therefore not include island regions. In addition to the islands, the brightness distribution of the SEM picture in FIG. 3 shows similar "surface-mixing" as in FIG. 2.

The XRD analysis performed at the target surfaces in the more detailed experiments according to Table 1 confirm the qualitative picture obtained from SEM observations. The short operation of the target in the DC mode (processes A and B) results in a strong peak shift or peak asymmetry of the Al phase towards $AlCr_{ss}$ [38.7° corresponds to the $AlCr_{ss}$ (111) reflection and 45.0° to the $AlCr_{ss}$ (200) reflection], which is visible in FIG. 6 and can be attributed to $AlCr_{ss}$ with a Cr content of about 2.6 at %. This indicates initiating of target surface melting by arcing. The formation of the $AlCr_{ss}$ is also detectable in FIG. 7 for the diffraction angles of 78.8° [$AlCr_{ss}$ (311) reflection] and 83.0° [$AlCr_{ss}$ (222) reflection]. The formation of the $AlCr_{ss}$ is accompanied by the formation of the $Al_4Cr$ and $Al_8Cr_5$. However, immediately after arc initiation the concentration of the intermetallics is low. The nearly identical diffraction patterns of the target surfaces obtained in processes A and B indicate that oxygen has only little influence at this state. This may be caused by initial reactions of the oxygen with the target surface which is suggested by the progressive arc splitting. This could also be explained by the reduced partial pressure due to getter processes which are more pronounced if the oxygen is flow and not pressure controlled. The fraction of the $AlCr_{ss}$ (processes C and D) is reduced for longer operation time and there is a slight shift of the $AlCr_{ss}$ peak to smaller angles, i.e. lower Cr concentrations. This is accompanied by a pronounced formation of intermetallic compounds. This suggests that the $AlCr_{ss}$ is more a transient state to the formation of the intermetallics. Obviously, the oxygen influences the transition of the $AlCr_{ss}$ to the formation of the intermetallic compounds. The target surface of process C shows a pronounced formation of the $Al_8Cr_5$ and Cr phases being visible in relatively strong diffraction peaks, while the Al content is reduced which is visible in the smaller Al (111) peak. At higher oxygen flow (process D), aluminium dominates at the target surface and the intermetallic compounds are present at about the same intensity level. If one assumes surface melting, this would indicate that $Al_8Cr_5$ has a higher probability of formation at 300 sccm oxygen flow compared to $Al_4Cr$. Consulting the binary phase diagram [12], the transition between liquid and solid phase formation of $Al_8Cr_5$ proceeds at a higher temperature than for $Al_4Cr$. If we now try to use the phase diagram to describe processes at the target surface (we are aware that this is not the way how phase diagrams are obtained and that we use it under non-equilibrium conditions), we find an approach for a rather simple explanation. Melting the target surface of a Al(70at %)-Cr(30at %) target without additional reactions and without evaporation (if it would be possible!) would result in a hypothetical melt of $Al_7Cr_3$. If this does not exist in the binary phase diagram it could be well approximated by a hypothetical "melt-mixture" of $Al_8Cr_5$ and $Al_4Cr$ and $AlCr_{ss}$.

If there is no reactive gas and the melt is cooling down, the intermetallics with the highest transition temperature solidifies. At this high temperature, the vapour pressure of aluminium is much higher than for chromium and therefore the residence time of aluminium at the target surface during cool down is very short and longer for chromium which is also reflected in the XRD pattern of process C. The situation changes if we have enough oxygen to react with the target surface. This may result in the oxidation of the "melt" and in similar vapour pressures of the "oxidized" intermetallics and metals (process D). The assumption can also explain the island formation in FIG. 3. If the target has a composition for which not all aluminium is consumed in the "surface melt" for intermetallics or solid solutions, we obtain a separation of the aluminium. Either this elemental aluminium will be vaporized at low oxygen partial pressure or oxidized to islands for higher oxygen pressure. The separation is of course more likely and not so easy to prevent for binary material systems for which many phases exist. This is the case in the Al—Cr material, but not in the Al—V material.

Pulsed operation of the sources results in a periodic deflection of the arc over the target surface. This is caused by the variation of the intrinsic magnetic field in the frequency of pulsing. The oxygen flow has low influence on the target surfaces operated in the pulsed arc discharge (process E and F). This can be explained by the increased reactive gas activation [11] which makes the processes at the target surface less dependent on oxygen flow.

Figure 9B:
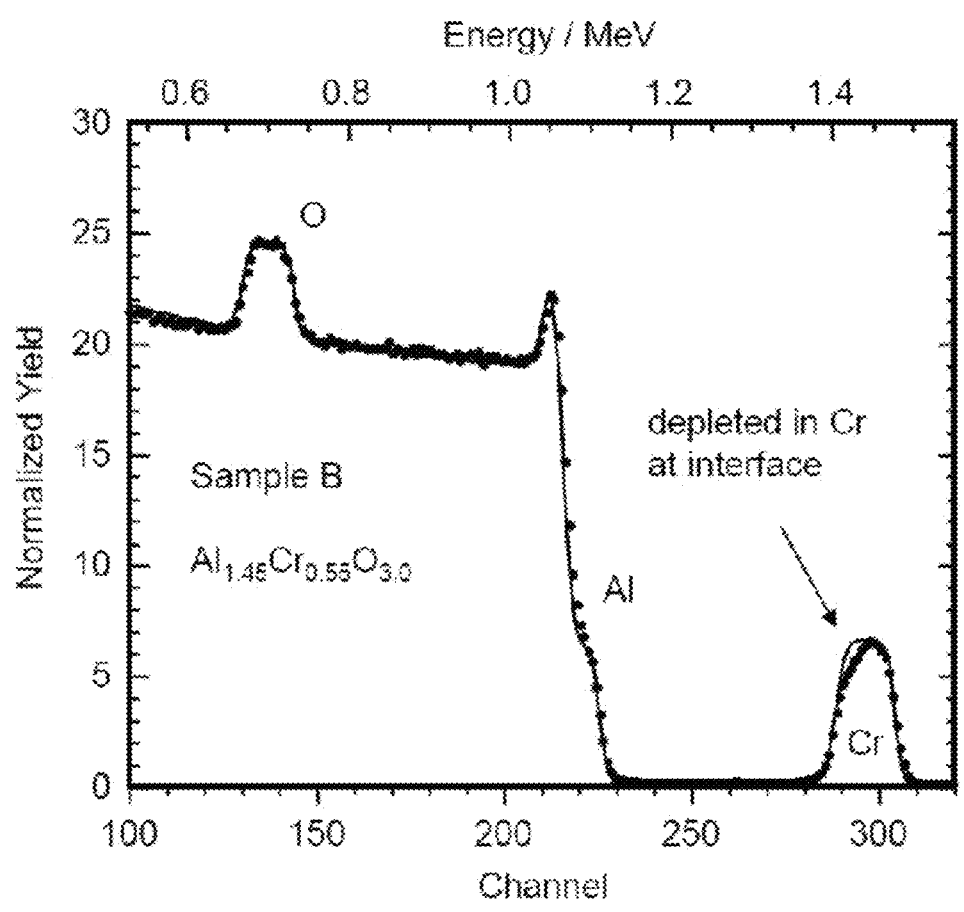

The XRD analysis of the layers (FIG. 8) shows the formation of the corundum-type Al—Cr—O solid solution. The crystallite size increases for higher oxygen flows. The $AlCr_{ss}$ phase is present in all layers. This is in accordance with the formation of the $AlCr_{ss}$ phase after initiation of the arc evaporation (XRD of target surface of process A and B) and occurs mainly during interface formation (start of target surface melting). The $AlCr_{ss}$ shows a higher Cr content (6 at %) than the $AlCr_{ss}$ at the target surface which may indicate the incorporation of vaporized chromium in the compound. $Al_8Cr_5$ is present in all layers with the highest intensity in sample C. The $Al_4Cr$ phase could not be identified in all layers. For the very thin layers (sample A and B), again an influence of the oxygen partial pressure is visible (FIG. 9). At lower pressure a gradient in the Cr signal indicates higher Al concentration near the interface and increasing Cr content during the 3 min of arc operation. Higher oxygen flow results in better uniformity of the Al—Cr composition over depth.

The investigation of the target surfaces and the synthesized layers for new powder metallurgical targets shows the transformation of the elemental target constituents to regions containing intermetallic compounds and solid solutions. This transformation can be regarded as a target conditioning by melting of the uppermost surface. The phase formation at the target surface during this process is mainly in agreement with the binary phase diagram of the target constituents as discussed above. The oxygen partial pressure has a strong influence on this conditioning process and changes the phase formation. This means that we observe non-stationary states at the target surface not only during conditioning, but also during variation of the reactive gas flow until a fully "oxidized" target state is achieved. This makes the ability to operate the targets in high oxygen flows without destabilizing the deposition process so important. During the non-stationary state, we observe an incorporation of solid solutions or intermetallics as can be seen from the layer analysis. This could be part of the layer design or could be suppressed, e.g. by the utilization of target shutters. The possibility to influence the stationary state by the proper selection of the target composition is an advantage of powder metallurgical targets which allow the free selection of the composition. It can be used as a tool to design the phase composition at the target surface.

The mechanism how the oxygen partial pressure influences the phase formation at the target surface is not clear. An oxide formation at the target going along with reduced vapour pressure would be one explanation. It is an interesting question, how the phase formation at the target surface and the oxidation of the surface influence the crystal structure of the synthesized layer. The formation of an intermetallic compound at the target surface will result in a change of the cohesive energy [13]. This could have an influence on ion energy and energy of condensation.

The transformations initiated by cathodic arc at the target surface of powder metallurgical produced targets were studied. The investigated Al—Cr target surfaces undergo a surface-melting process which produces intermetallic compounds and solid solutions in fair agreement with the binary phase diagram of Al—Cr. The intermetallic compounds and solid solutions are incorporated in the layer growth during this target surface conditioning. The final stabilization of the target surface can be influenced by a proper selection of the target composition and by the oxygen partial pressure.

There are two competing process taking place at the target surface: (1) melting by the arc and (2) oxidation of the surface and the melt. If the oxygen partial pressure is not high enough for a fully oxidation of the target surface, the formation of intermetallics with a high transition temperature for the liquid-solid-phase according to the binary phase diagram will form and the low melting point material will be reduced due to the reduced residence time at the target surface at these high temperatures. This formation of high melting point intermetallics can be used to increase the cohesive energy and to achieve vaporized material with higher energy and/or ionization. The higher energy will be set free during condensation and increase the available energy for the formation of crystal structures during condensation and to form oxides with crystal structures which eventually cannot be synthesized from elemental targets. In the fully oxidized state of the target surface, the vapour pressure of the elements and the intermetallis and solid solutions at the target surface changes more to the vapour pressure of the oxides. This can imply, that high melting point material (e.g. Ta, Zr) or any solid solution or intermetallics) may be vaporized as oxide before it is melted. It can also mean that low melting point material (e.g. Al) will be vaporized at higher temperature because it will be oxidized before it is vaporized as metal. Therefore, the oxidation of the target surface can be also used to increase the cohesive energy of low melting point material. Therefore, there exist two approaches to alter the cohesive energy for the synthesis of oxides from composite taregets: (1) melting the target surface and forming solid solutions and intermetallics, (2) oxidizing the elemental and solid solutions and intermetallics at the target surface.

It was shown that both effects can also be used to avoid the oxide island growth at the target surface. This is because in this process it is possible to influence the phase formation at the target surface.

The main outcome is however the fact, that the described process allows via control of the phase formation at the surface of composite targets the design of the crystal structure of the synthesized layers using the alteration of the cohesive energy of the target material.

LIST OF TABLE CAPTIONS

Table 1
Parameters utilized for the operation of the Al—Cr composite targets and for synthesis of the samples in the processes A, B, C, D, E and F.

LIST OF FIGURE CAPTIONS

FIG. 1
SEM (back-scattered) picture of the surface of a new (unused) powder metallurgical produced Al—Cr target with the nominal composition of 70 at % Al and 30 at % Cr.

FIG. 2
SEM picture of the Al—Cr target surface obtained after the deposition process: 300 sccm oxygen flow, 200 A DC, 75 min.

FIG. 3
SEM picture of the Al—Cr target surface obtained after the deposition process: 800 sccm oxygen flow, 200 A DC, 75 min. The target surface shows the growth of oxide islands at this high oxygen flow.

FIG. 4
SEM picture of an Al—V target surface with a nominal composition of 65 at % Al and 35 at % V after deposition process: 1000 sccm oxygen flow, 200 A DC, 60 min. The surface shows strong oxide island formation.

FIG. 5
SEM picture an Al—V target surface with a nominal composition composition of 85 at % Al and 15 at % V after deposition process: 1000 sccm oxygen flow, 200 A DC, 60 min. There is no island formation at the target surface.

FIG. 6
The XRD patterns (2Theta: 36°-46°) of the target surfaces A, B, C, D, E and F show the presence of Al (triangle), Cr (circle), Al4Cr (square) and Al8Cr5 (diamond).

FIG. 7
High angle XRD patterns (2Theta: 55°-85°) for targets A, B, C, D, E and F. Indexed phases: Al (triangle), Cr (circle), Al4Cr (square) and Al8Cr5 (diamond) phases.

FIG. 8
XRD patterns of the layers C, D, E and F show the presence of Al8Cr5 (diamond) intermetallic compound, corundum-type Al—Cr—O (down triangle) and AlCr solid solution (star).

FIG. 9
RBS spectrum of sample A which was synthesized with 300 sccm (a) oxygen flow is shown in comparison with sample B synthesized with 800 sccm oxygen flow (b). The Cr signal in the spectrum (a) shows a gradient in the composition of A. Spectrum (b) indicates much better uniformity for B.

TABLE 1

| Process (Target/ Sample) | Target Al/Cr [at %] | Arc Current [A] | Oxygen Flow [sccm] | Total Pressure [Pa] | Operation Time [min] | Layer Thickness [µm] |
|---|---|---|---|---|---|---|
| A | Al/Cr (70/30) | 200 (DC) | 300 | 0.7 | 3 | 0.1 |
| B | Al/Cr (70/30) | 200 (DC) | 800 | 1.8 | 3 | 0.1 |
| C | Al/Cr (70/30) | 200 (DC) | 300 | 0.7 | 30 | 0.9 |

TABLE 1-continued

| Process (Target/ Sample) | Target Al/Cr [at %] | Arc Current [A] | Oxygen Flow [sccm] | Total Pressure [Pa] | Operation Time [min] | Layer Thickness [μm] |
|---|---|---|---|---|---|---|
| D | Al/Cr (70/30) | 200 (DC) | 800 | 1.8 | 30 | 0.6 |
| E | Al/Cr (70/30) | 200 (470/50 pulsed) | 300 | 0.7 | 30 | 1.3 |
| F | Al/Cr (70/30) | 200 (470/50 pulsed) | 800 | 1.8 | 30 | 1.0 |

REFERENCES

[1] B. K. Tay, Z. W. Zhao, D. H. C. Chua, Materials Science and Engineering, R 52 (2006) 1

[2] J. Ramm, M. Ante, T. Bachmann, B. Widrig, H. Brändle, M. Döbeli, Surf. Coat. Technol. 202 (2007) 876

[3] W.-Y. Ho, D.-H. Huang, L.-T. Huang, C.-H. Hsu, D.-Y. Wang, Surf. Coat. Technol. 177-178 (2004) 172

[4] J. T. Chang, C. H. Yeh, J. L. He, K. C. Chen, A. Matthews, A. Leyland, Surf. Coat. Technol. 200 (2005) 1401

[5] D. Levchuk, H. Bolt, M. Döbeli, S. Eggenberger, B. Widrig, J. Ramm, Surf. Coat. Technol. 202 (2008) 5043

[6] J. Ramm, M. Ante, H. Brändle, A. Neels, A. Dommann, M. Döbeli, Advanced Engineering Materials 9 (2007) 604

[7] PDF-2, International Centre for Diffraction Data, 12 Campus Boulevard, Newtown Square, Pa. 19073.

[8] H. P. Klug and L. E. Alexander in: X-ray Diffraction Procedures, John Wiley & Sons Inc, 2nd edition, New York, 1974.

[9] W. K. Chu, J. W. Mayer, M. A. Nicolet in: Backscattering Spectrometry, Academic Press, 1978

[10] L. R. Doolittle, Nucl. Instr. and Meth. B15 (1986) 227

[11] L. de Abreu Vieira, M. Döbeli, A. Dommann, E. Kalchbrenner, A. Neels, J. Ramm, H. Rudigier, J. Thomas, B. Widrig, Surf. Coat. Technol. 204 (2010) 1722

[12] Phase Diagram of AlCr, Journal of Phase Equilibria and Diffusion, vol. 29, no. 1, 2008

[13] A. Anders in: Cathodic Arcs, Springer, 2008

What is claimed is:

1. A method for synthesizing layers on a substrate comprising steps of:
   placing a composite target in a chamber and evacuating the chamber;
   prior to the synthesizing of the layers on a substrate, conditioning a surface of the composite target to form a conditioned composite target by transforming constituents of the composite target to regions containing intermetallic compounds and solid solutions by:
      exposing the surface of the composite target to a reactive gas consisting of oxygen, the reactive gas introduced into the chamber during an arc operation to melt the surface of the composite target in the presence of the reactive gas, wherein a pulsed power supply is applied to the composite target during the arc operation, and
      varying a flow rate of the reactive gas into the chamber to alter a cohesive energy of the composite target and to transition the surface of the composite target from a non-stationary state to a fully oxidized state, wherein during the non-stationary state, an incorporation of solid solutions or intermetallics occurs, the flow rate of the reactive gas selected to achieve an oxygen partial pressure that results in the fully oxidized state of the surface of the composite target and vaporizing of a high melting point material or any solid solution or intermetallics as an oxide before the surface of the composite target is melted, thereby forming the conditioned composite target; and
   synthesizing the layers on the substrate by reactive cathodic arc evaporation using the conditioned composite target.

2. The method according to claim 1, characterized in that during the reactive cathodic arc evaporation a substrate temperature of 550° C. is selected.

3. The method according to claim 1, characterized in that the synthesizing includes a substrate bias of −60 V.

4. The method according to claim 1 characterized in that the flow rate of the reactive gas is controlled by a flow controller.

5. The method according to claim 1 characterized in that the composite target is a powder metallurgical produced target.

6. The method according to claim 1 characterized in that the composite target comprises Al—Cr.

* * * * *